United States Patent
Hohage et al.

(10) Patent No.: US 7,678,699 B2
(45) Date of Patent: *Mar. 16, 2010

(54) METHOD OF FORMING AN INSULATING CAPPING LAYER FOR A COPPER METALLIZATION LAYER BY USING A SILANE REACTION

(75) Inventors: Joerg Hohage, Dresden (DE); Matthias Lehr, Dresden (DE); Volker Kahlert, Dresden (DE)

(73) Assignee: Advanced Micro Devices, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 11/531,084

(22) Filed: Sep. 12, 2006

(65) Prior Publication Data

US 2007/0123044 A1 May 31, 2007

(30) Foreign Application Priority Data

Nov. 30, 2005 (DE) ...................... 10 2005 057 057

(51) Int. Cl.
*H01L 21/44* (2006.01)

(52) U.S. Cl. ................ 438/687; 438/906; 257/E21.575

(58) Field of Classification Search .................. 438/687, 438/906; 257/E21.575
See application file for complete search history.

(56) References Cited

U.S. PATENT DOCUMENTS

| 5,447,887 | A | 9/1995 | Filipiak et al. ............... 437/200 |
|---|---|---|---|
| 6,368,967 | B1 | 4/2002 | Besser ........................ 438/687 |
| 6,429,128 | B1* | 8/2002 | Besser et al. ................ 438/687 |
| 6,599,827 | B1* | 7/2003 | Ngo et al. ................... 438/627 |
| 6,797,652 | B1 | 9/2004 | Ngo et al. ................... 438/931 |
| 6,852,373 | B1* | 2/2005 | Motte et al. .................. 427/579 |
| 6,939,797 | B2* | 9/2005 | Barth et al. .................. 438/628 |
| 2003/0045086 | A1* | 3/2003 | Noguchi et al. ............. 438/621 |
| 2003/0072695 | A1* | 4/2003 | Ruelke et al. ............... 422/186 |
| 2003/0134495 | A1* | 7/2003 | Gates et al. ................. 438/600 |
| 2003/0224599 | A1* | 12/2003 | Zistl et al. ................... 438/678 |
| 2003/0228750 | A1* | 12/2003 | Lee et al. .................... 438/623 |

(Continued)

FOREIGN PATENT DOCUMENTS

DE    10150822    4/2003

(Continued)

OTHER PUBLICATIONS

German communication dated Jan. 11, 2007 for serial No. 10 2005 057 057.7-33.

(Continued)

*Primary Examiner*—Hsien-ming Lee
*Assistant Examiner*—Kevin Parendo
(74) *Attorney, Agent, or Firm*—Williams, Morgan & Amerson, P.C.

(57) ABSTRACT

A new technique is disclosed in which a barrier/capping layer for a copper-based metal line is formed by using a thermal-chemical treatment with a surface modification on the basis of a silicon-containing precursor followed by an in situ plasma-based deposition of silicon nitride and/or silicon carbon nitride. The thermal-chemical treatment is performed on the basis of an ammonium/nitrogen mixture in the absence of any plasma ambient.

19 Claims, 4 Drawing Sheets

U.S. PATENT DOCUMENTS

2004/0038550 A1* 2/2004 Chen et al. ............ 438/740
2004/0130030 A1* 7/2004 Kunimune et al. ........ 257/758
2004/0150113 A1* 8/2004 Tonegawa ............. 257/758
2004/0266171 A1* 12/2004 Aoki et al. ............ 438/622

FOREIGN PATENT DOCUMENTS

DE    102005035740 A1    2/2007

OTHER PUBLICATIONS

U.S. Office Action Dated Sep. 5, 2007 for U.S. Appl. No. 11/383,824.
U.S. Office Action Dated May 13, 2008 for U.S. Appl. No. 11/383,824.
Translation of Official Communication from German Patent Application No. 10 2005 057 057.7-33 dated Jun. 8, 2009.

* cited by examiner

METHOD OF FORMING AN INSULATING CAPPING LAYER FOR A COPPER METALLIZATION LAYER BY USING A SILANE REACTION

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material including a capping layer acting as an efficient diffusion barrier layer for the metal.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 µm and less, a limiting factor of device performance is the signal propagation delay caused by the switching speed of the transistor elements. As the channel length of these transistor elements has now reached 0.1 µm and significantly less, it turns out, however, that the signal propagation delay is no longer limited by the field effect transistors, but is limited, owing to the increased circuit density, by the interconnect lines, since the parasitic line-to-line capacitance is increased and the conductivity of the lines is reduced due to their reduced cross-sectional area. The parasitic RC time constants therefore require the introduction of a new type of material for forming the metallization layer.

Traditionally, metallization layers are formed by a dielectric layer stack including, for example, silicon dioxide and/or silicon nitride, with aluminum as the typical metal. Since aluminum exhibits significant electromigration at higher current densities that may be necessary in integrated circuits having extremely scaled feature sizes, aluminum is being replaced by copper, which has a significantly lower electrical resistance and a higher resistivity against electromigration. For highly sophisticated applications, in addition to using copper and/or copper alloys, the well-established and well-known dielectric materials silicon dioxide ($k \approx 4.2$) and silicon nitride ($k > 5$) may be replaced by so-called low-k dielectric materials. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines. Typically, in the damascene technique, the dielectric layer is deposited and then patterned to receive trenches and vias that are subsequently filled with copper by plating methods, such as electroplating or electroless plating. Forming copper-based metallization layers in standard dielectric materials, such as silicon dioxide and a plurality of low-k dielectrics, is presently frequently being practiced by providing a dielectric diffusion barrier layer on top of the copper-based region as copper readily diffuses in a plurality of dielectrics, such as silicon dioxide and in many low-k dielectrics. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration. For instance, silicon nitride is known as an effective copper diffusion barrier and may be used as a capping layer. In other cases, when the moderately high permittivity of silicon nitride is considered inappropriate, nitrogen-enriched silicon carbide (SiCN) is frequently used as a copper diffusion barrier. Despite the diffusion hindering effect of the silicon nitride capping layers and silicon carbide-based capping layers, it turns out, however, that copper's resistance against electric current induced material transport (electromigration) strongly depends on the characteristics of an interface between the copper-based metal and the adjacent capping layer. Therefore, in sophisticated integrated circuits featuring high current densities, it is generally preferable to design the deposition process for the capping layer such that a desired high adhesion and thus high performance with respect to electromigration is achieved. For this purpose, corresponding deposition techniques with preceding plasma-based cleaning steps are typically used.

Figure 1A:
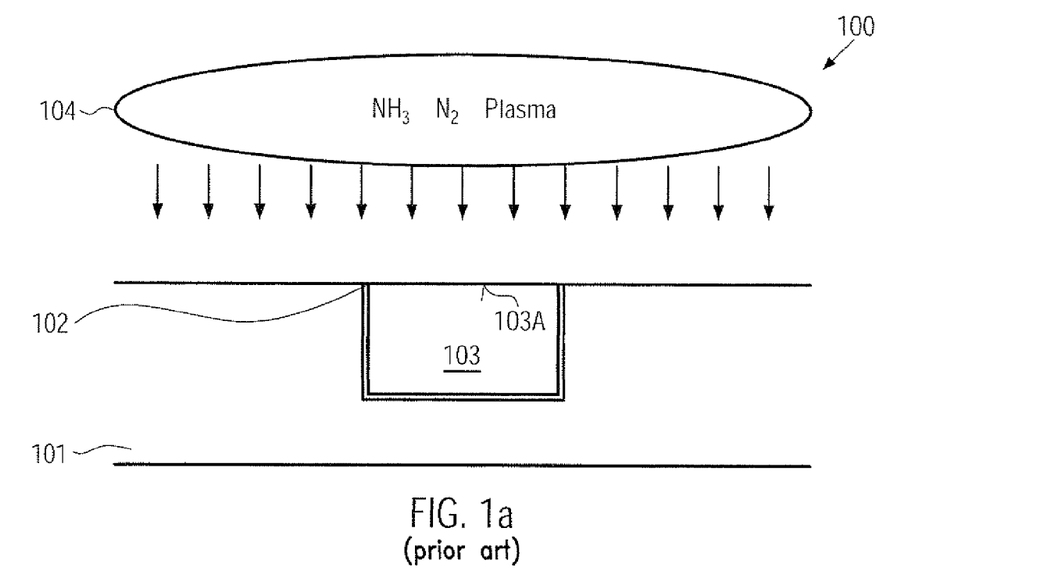
FIGS. 1a-1b schematically show cross-sectional views of a conventional semiconductor device during the formation of a nitrogen-enriched silicon carbide (SiCN) capping layer, wherein an exposed copper surface is precleaned by means of a plasma treatment.
Figure 1B:
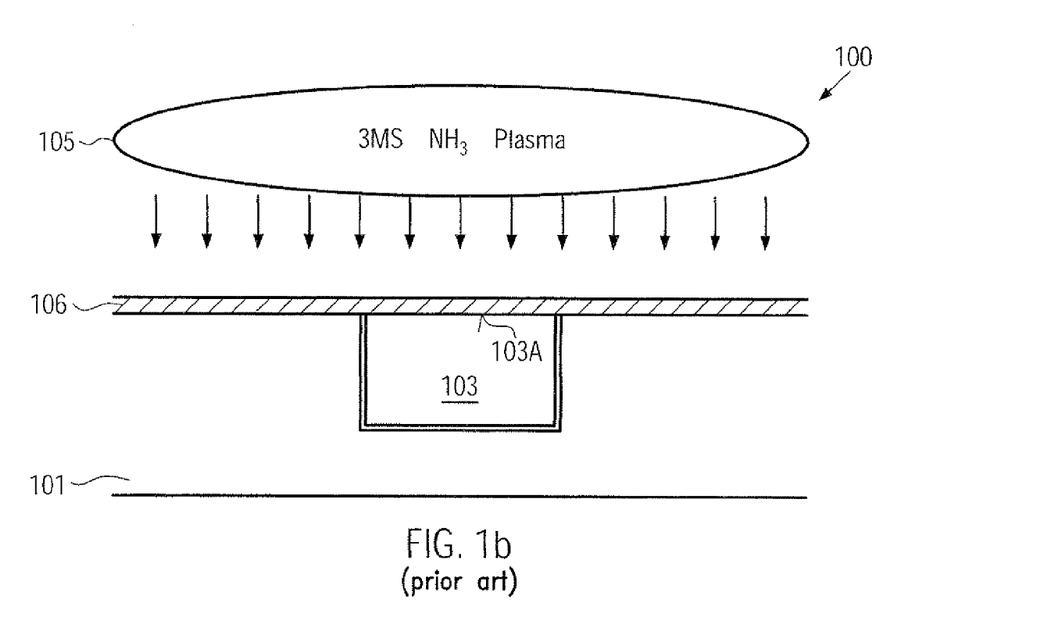

With reference to FIGS. 1a-1b, a typical conventional process flow for forming a SiCN capping layer will now be described in more detail. FIG. 1a schematically shows a cross-sectional view of a semiconductor device 100 prior to the formation of a silicon nitride or a nitrogen-enriched silicon carbide based capping layer on a copper-containing metal region. The semiconductor device 100 comprises a substrate 101 that may include circuit elements, such as transistors, capacitors and the like, which for convenience are not shown. Moreover, the substrate may have formed thereon one or more metallization layers, i.e., dielectric layers, in which are embedded metal-filled lines and vias so as to establish the required electrical connections between the individual circuit elements. For convenience, a single copper-based metal region 103 is illustrated to represent any copper-based metal lines of one or more metallization layers. The copper-based metal region 103 may be embedded in any appropriate dielectric material, such as silicon dioxide, fluorine-doped silicon dioxide, a low-k material such as hydrogen-enriched silicon oxycarbide (SiCOH), or any combination thereof. As previously explained, the copper may readily diffuse in a plurality of dielectric materials and hence a conductive barrier layer 102 is typically provided between the dielectric material of the substrate 101 and the copper-containing material of the region 103. The barrier layer 102 may be comprised of two or more individual layers to provide the required characteristics, not only in view of the copper diffusion blocking effect, but also with respect to adhesion to the surrounding material and the like. For example, tantalum, tantalum nitride, titanium, titanium nitride and combinations thereof are frequently used as appropriate materials for the barrier layer 102.

A typical process flow for forming the semiconductor device 100 as shown in FIG. 1a may comprise the following processes. After the formation of any circuit elements, which may exhibit extremely scaled critical dimensions in sophisticated applications, such as a gate length of field effect transistors in the range of approximately 50-100 nm and even less, one or more metallization layers may be formed in accordance with well-established single damascene or dual damascene techniques. That is, an appropriate dielectric layer stack, including an etch stop/barrier layer similar to the capping layer that is to be formed on top of the copper-based metal region 103, may be deposited, followed by another dielectric layer, such as silicon dioxide or a low-k dielectric material, which may be formed by well-established techniques, such as plasma enhanced chemical vapor deposition (PECVD), spin-on techniques and the like.

Thereafter, the dielectric layer stack may be patterned by photolithography and etch techniques to form trenches and vias in the dielectric layer stack, wherein the lower etch stop/barrier or capping layer (not shown) may be used as an etch stop. For convenience, only a single trench may be considered for the further description, in which the copper-based metal region 103 is to be formed. Thus, after the patterning of the corresponding trench, the barrier layer 102 may be deposited on the basis of well-established deposition techniques, such as sputter deposition, chemical vapor deposition (CVD), atomic layer deposition (ALD) and the like. For instance, well-established recipes for the sputter deposition of tantalum and tantalum nitride, as well as titanium and titanium nitride, may be used to form the barrier layer 102 having the desired characteristics. Thereafter, a seed layer (not shown) comprised of, for instance, copper may be formed by sputter deposition or any other appropriate deposition technique. Based on the seed layer, a copper-based material, such as pure copper, a copper alloy or any combination thereof, may be deposited by, for instance, electroplating, thereby reliably filling the previously formed trenches and vias and also forming the copper-based metal region 103.

Next, excess material deposited during the preceding electrochemical deposition process as well as the seed layer and the conductive barrier layer 102 formed on portions outside the copper-based metal region 103 may be removed to provide the electrically insulated copper-based metal region 103. For this purpose, a removal process typically comprising a chemical mechanical polishing (CMP) process may be performed, during which a surface 103A of the region 103 is exposed, which may thus be subjected to any chemical reactions, resulting in discolored and eroded or oxidized portions on the surface 103A, since copper may readily react with moisture, oxygen, fluorine and other traces of gases that may typically be encountered during the removal of the excess material and subsequent substrate handling processes. Consequently, prior to the formation of an insulating capping layer, which may also act as an etch stop layer for the formation of any further metallization layers on top of the substrate 101, the surface 103A is typically cleaned in order to enhance conductivity and the adhesion characteristics and thus the electromigration behavior of the region 103. To this end, a plasma-based treatment may be performed to efficiently remove oxidized, discolored and eroded portions from the surface 103A while at the same time substantially avoiding a re-formation of these portions. For example, a plasma ambient 104 may be established on the basis of ammonia ($NH_3$) and nitrogen ($N_2$), wherein the plasma ignition is typically performed on the basis of radio frequency (RF), the power density of which may significantly determine, in combination with the gas flows of ammonia and nitrogen, the effectiveness of the plasma treatment 104. For instance, with appropriately selected gas flows in the range of approximately 500-600 sccm (standard cubic centimeter per minute) and 6000 sccm for ammonia and nitrogen, respectively, and an RF power of 200 watts for a plasma deposition chamber such as the Producer™ available from Applied Materials Corporation, a good adhesion for a nitrogen-enriched silicon carbide (SiCN) layer may be obtained. After the plasma treatment 104, the ambient may be changed by applying appropriate precursor materials so that an appropriate deposition atmosphere may be established in situ, thereby avoiding undue discoloration and oxidation on the exposed surface 103A. After a corresponding stabilization step for introducing the precursor gases, such as 3MS (tri-methylsilane) and ammonia for forming a nitrogen-enriched silicon carbide layer, an appropriate RF power may be supplied to establish a corresponding plasma, thereby initiating the deposition process.

FIG. 1b schematically shows the semiconductor device 100 during this deposition step, wherein, on the basis of the plasma 105 containing 3MS, ammonia ($NH_3$) and helium (He), a capping layer 106 comprised of nitrogen-enriched silicon carbide (SiCN) is formed above the substrate 101 and on the exposed surface 103A, thereby creating a corresponding interface, which is, for convenience, also referred to as 103A. Thereafter, further processing may be continued by forming further metallization layers, wherein the capping layer 106 may act as an etch stop layer for patterning a corresponding dielectric layer stack for forming corresponding vias and trenches.

During the operation of the device 100, the current-induced material transport, also referred to as electromigration, at the interface 103A may nevertheless reach critical values, especially when a copper-based metal region 103 is part of a higher metallization layer. Thus, for sophisticated applications requiring increased current densities, the resistance with respect to electromigration provided by the conventional process flow may no longer be appropriate.

In view of the situation described above, there exists a need for an enhanced technique that enables the formation of copper-based metallization layers including an efficient capping layer with enhanced resistance against electromigration.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of an insulating barrier or capping layer for a copper-based metal region, wherein an exposed surface of the copper region is pretreated on the basis of a thermal-chemical reaction, rather than a plasma treatment, thereby significantly improving the interface between the exposed copper surface and a subsequently in situ deposited capping layer. Moreover, a surface modification of the chemically cleaned copper surface may be generated on the basis of a silicon-containing precursor, which may, in some embodiments, comprise at least one of 4MS (tetra-methyl silane), 3MS (tri-methyl silane) and silane ($SiH_4$), for obtaining a reinforced surface and, after deposition of the barrier material, an enhanced interface between copper and the dielectric material. Consequently, improved characteristics with respect to, for instance, electromigration may be achieved while, on the other hand, a significantly reduced process time is obtained compared to conventionally manufactured capping layers with a plasma-treated copper surface.

According to one illustrative embodiment of the present invention, a method comprises forming a copper-based metal region in a dielectric layer of a metallization layer of a semiconductor device, wherein the copper-based metal region has an exposed surface. Moreover, the exposed surface is cleaned by means of a thermal-chemical treatment in a specified environment. Then, the cleaned surface is modified by a thermal treatment on the basis of a silicon-containing precursor. Finally, a capping layer is deposited on the exposed surface within the specified environment.

In accordance with another illustrative embodiment of the present invention, a method comprises providing a semiconductor device comprising a substrate having formed thereon a copper-based metal region having an exposed surface. Furthermore, the exposed surface is pretreated in the absence of a plasma ambient to prepare the exposed surface for receiving a capping layer thereon, wherein the pretreatment comprises a surface modification process on the basis of a silicon-containing precursor. Finally, the capping layer is deposited in situ in the presence of a deposition plasma ambient.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates a new technique for the formation of a dielectric barrier or capping layer for exposed copper-based metal regions, such as metal lines as are typically used in sophisticated semiconductors including copper-based metallization layers, possibly in combination with low-k dielectric materials, wherein moderately high current densities and operating temperatures may be encountered in the metal lines during the operation of the devices. As previously explained, stress-induced material transport phenomena in conductive lines may significantly influence the overall reliability and lifetime of semiconductor devices as the failure of even one single conductive line within the metallization layer may cause a failure of the device or may at least reduce the reliability thereof. Material transport in metal lines, such as electromigration, which describes the phenomenon of copper diffusion induced by an electric current in a metal line, thus creating voids and hillocks in the metal line, may significantly depend on the characteristics of diffusion paths that are typically formed at interfaces between two different material layers. Recent investigation seems to confirm that the characteristics of the interface between copper-based metal and the capping layer, which is typically based on silicon and/or carbon and/or nitrogen, may have a strong influence on the copper-based metal line's resistance against electromigration. Thus, conventionally, the exposed copper-based surface is cleaned by a plasma treatment prior to the actual deposition so as to efficiently remove copper oxide in order to achieve good adhesion on copper. For instance the coefficient $G_c$, indicating the adhesion "strength" of a material on a substrate is greater than 20 J/m$^2$ for a typical conventional silicon carbide nitride capping layer formed on the basis of a plasma-based cleaning treatment. However, as previously noted, the electromigration at a copper/SiCN interface can nevertheless reach critical values, especially in higher metallization levels, thereby rendering a corresponding metallization less reliable for highly sophisticated applications. Moreover, a silicon nitride layer may not be a desirable alternative in conventional techniques, since a conventional ammonia/nitrogen-based plasma pretreatment is critical, as silane, i.e., the precursor of the silicon nitride deposition process, may readily diffuse into the plasma cleaned copper surface, which is also heated by the interaction with the plasma, thereby resulting in a copper silicide formation that may not be controlled and thus significantly affecting the resulting characteristics of the capping layer/copper interface in a non-predictable manner.

According to the principles of the present invention, the pretreatment of the exposed copper-based surface is performed in the absence of a plasma ambient, thereby resulting in a highly efficiently cleaned copper surface with a significantly reduced amount of surface irregularities, such as hillocks and voids and the like. Moreover, a well-controllable surface modification that is thermally driven may be initiated on the basis of a silicon-containing precursor, such as silane, 3MS, 4MS and the like, wherein the missing plasma, i.e., RF power coupled into the surface region in conventional techniques enables a control of the silane diffusion and thus of the generation of copper silicide and nitrogen-containing copper silicide in the copper surface, which may then provide enhanced interface characteristics with capping layer deposited subsequently. In this respect, the term "in the absence of a plasma ambient" is to be understood such that the treatment is performed substantially on the basis of a chemical reaction, which is thermally activated by the heated surface, in a gaseous environment, wherein the gas components have a non-directional thermal motion with a possible fraction of ionized particles that corresponds to the fraction created by the mutual interaction of the gaseous components without applying an external electromagnetic field. Thus, "in the absence of a plasma ambient" is to be understood such that plasma-induced effects, if any external electromagnetic fields are present in the environment surrounding the exposed copper-based surface, such as plasma-induced ion bombardment, substrate charging and the like, are negligible compared to the pure thermal-chemical effect caused by components of the gaseous environment.

Figure 2A:
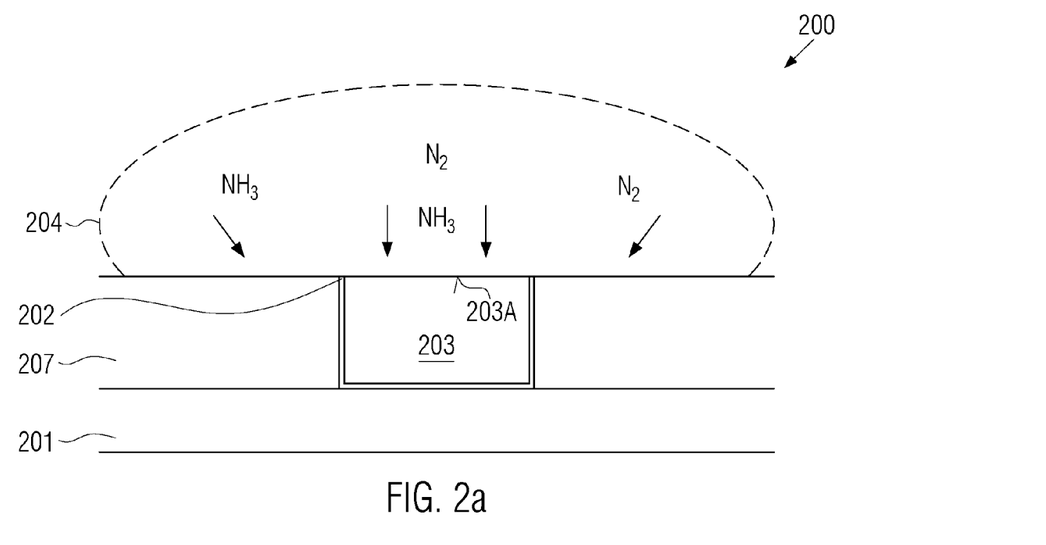
FIGS. 2a-2g schematically show cross-sectional views of the formation of a capping layer for a copper-based metal region on the basis of a thermal-chemical pretreatment including a surface modification on the basis of silane according to illustrative embodiments of the present invention.

With reference to FIGS. 2a-2g, further illustrative embodiments of the present invention will now be described in more detail. FIG. 2a schematically shows a semiconductor device 200 in cross-sectional view in an advanced manufacturing stage. The semiconductor device 200 may represent a device comprising circuit elements, such as transistors, possibly in combination with other microstructural features for forming mechanical and/or optical components. The device 200 may comprise a substrate 201, which may be provided in the form of a bulk silicon substrate, a silicon-on-insulator (SOI) substrate, or any other appropriate semiconductive or insulating carrier having formed thereon an appropriate semiconductor layer for the formation of circuit elements. For convenience, any such circuit elements are not shown. Moreover, the device 200 may comprise one or more metallization layers including copper-based metal lines and vias, wherein, for convenience, a single metallization layer 207 is shown in FIG. 2a. The metallization layer 207 may be comprised of any appropriate dielectric material, including one or more copper-based metal regions 203, wherein the copper-based metal region 203 may represent a metal line embedded in the dielectric material of the layer 207, which may be provided in the form of silicon dioxide, fluorine-doped silicon dioxide, a low-k dielectric material, such as SiCOH, polymer materials, or any combination thereof. The copper-based metal region 203 may comprise a barrier layer 202 formed of any appropriate barrier/adhesion material, such as tantalum, tantalum nitride, titanium, titanium nitride, any combination thereof or any other appropriate materials. Moreover, the barrier layer 202 may be comprised of two or more individual layers of different material composition. The remaining conductive material of the region 203 may be comprised of copper or a copper alloy. The device 200 is shown in a manufacturing sequence wherein a surface 203A is exposed and is to receive a dielectric barrier or capping layer. Due to any preceding processes, the exposed surface 203A may comprise a plurality of unwanted surface irregularities, such as oxidized, discolored and eroded portions, which are for convenience not shown in FIG. 2a.

A typical process flow for forming the device 200 as shown in FIG. 2a may comprise substantially the same processes as are previously described with reference to the device 100. That is, well-established process techniques may be used for forming any circuit elements and other microstructural features followed by well-established single or dual damascene techniques for forming the metallization layer 207. During the process sequence for forming the metallization layer 207, the surface 203A of the copper-based region 203 may have been exposed, for instance by CMP, so as to provide the copper-based region 203 as an electrically insulated conductive region. Subsequently, the device 200 may be treated in a specified environment 204 to prepare the exposed copper-containing surface 203A for receiving a capping layer thereon having a high resistance against electromigration. The specified environment 204 may be established by creating a gaseous atmosphere surrounding the exposed surface 203A, wherein the specified environment 204 is established in the absence of a plasma ambient, contrary to conventional strategies in which the treatment of an exposed copper-based surface includes a plasma treatment prior to the subsequent in situ capping layer deposition.

It should be noted that the specified environment 204 may be established in any appropriate process tool that enables a plasma-based deposition, such as a PECVD tool available from Applied Materials known as Producer™. Dependent on wafer size and chamber geometries, the given process parameters may be adjusted according to the teaching provided herein. In one illustrative embodiment, the specified environment 204 is established on the basis of a mixture of ammonia ($NH_3$) and nitrogen ($N_2$) wherein a pressure of approximately 1-6 Torr, for example approximately 3.0 Torr, is created. Moreover, the ratio of ammonia and nitrogen may range from approximately 1:400 to 1:1 or even substantially pure ammonia may be used, which may be achieved for the above-identified PECVD process tool with flow rates of approximately 50-1,000 sccm, for instance approximately 170 sccm, for ammonia, and approximately 1,000-20,000 sccm, for instance approximately 5,000 sccm, for nitrogen. Moreover, the substrate 201 may be heated to approximately 250-500° C., for instance approximately 350° C., thereby also heating the exposed surface 203A. Upon the interaction of the gas mixture in the specified environment 204, a thermally-induced chemical cleaning process of the surface 203A is achieved. In illustrative embodiments, this step of pretreatment is performed for approximately 5-60 seconds, for instance for approximately 10 seconds.

Figure 2B:
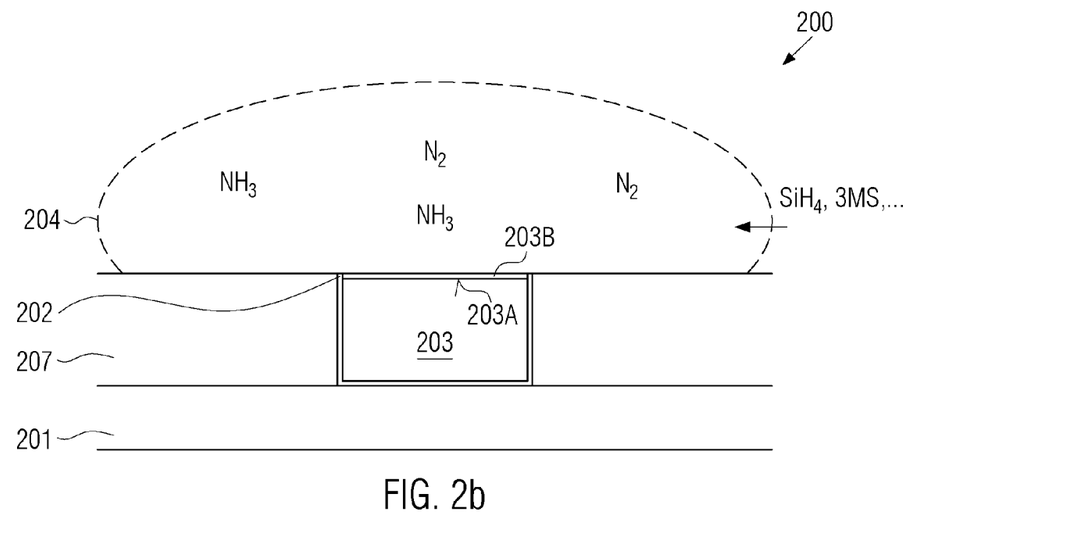

FIG. 2b schematically shows the semiconductor device 200 in a further advanced stage of the thermal-chemical pre-treatment of the exposed surface 203A in the absence of a plasma ambient. In this stage, silane ($SiH_4$) or 3MS, or other appropriate silicon-containing precursor, such as 4MS, for modifying the exposed surface 203A are introduced into the ambient 204. The silicon-containing precursor, such as silane or 3MS and the like, may diffuse into the copper of the surface 203A, wherein the degree of diffusion and thus generation of silicon and nitrogen-containing copper compounds is efficiently controllable by adjusting the process parameters of the ambient 204, which is believed to reside in the fact of the absence of plasma or RF or LF (low frequency) power. The modification of the exposed surface 203A may therefore result in a modified layer 203B including copper silicide and nitrogen-containing copper silicide. For controllably modifying the surface 203A for creating the layer 203B, substantially the same parameter values may be used as described above for the chemical treatment, while additionally silane, 3MS and the like is supplied to the ambient 204, wherein a ratio of 3MS, silane and the like and nitrogen may range from approximately 1:1000 to 1:60. A corresponding ratio may be achieved with the above-indicated deposition tool by selecting the flow rate of the silicon-containing precursor, such as silane, 3MS and the like, to be approximately 20-330 sccm, for example approximately 200 sccm. Based on the above parameter values, the modification may be performed for approximately 1-60 seconds, for instance for approximately 10 seconds.

Figure 2C:
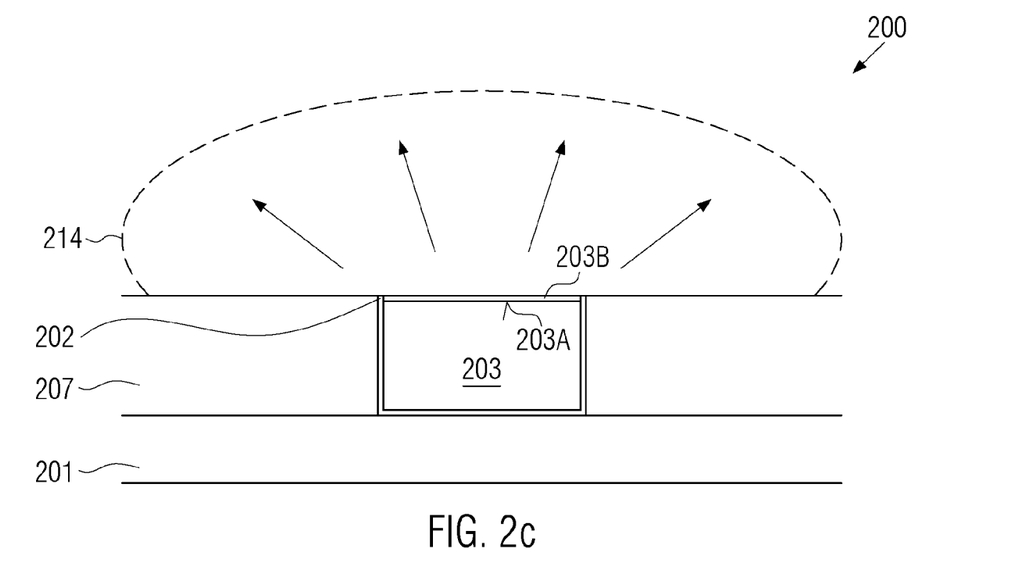

FIG. 2c schematically illustrates the semiconductor device 200 in a further advanced stage after the modification, thereby forming the layer 203B. In this step, the device may be subjected to an ambient 214 that is appropriate to remove gas residuals and gaseous byproducts resulting from the preceding modification process. The ambient 214 may be established in the same process chamber as may have been used for the ambient 204 by discontinuing the supply of gases and pumping the process chamber for efficiently removing unwanted gaseous components. In one illustrative embodiment, the pumping step may be performed for approximately 3-15 seconds, for example, for approximately 5 seconds, wherein a temperature of the substrate 201 may be maintained within the above-specified range.

Figure 2D:
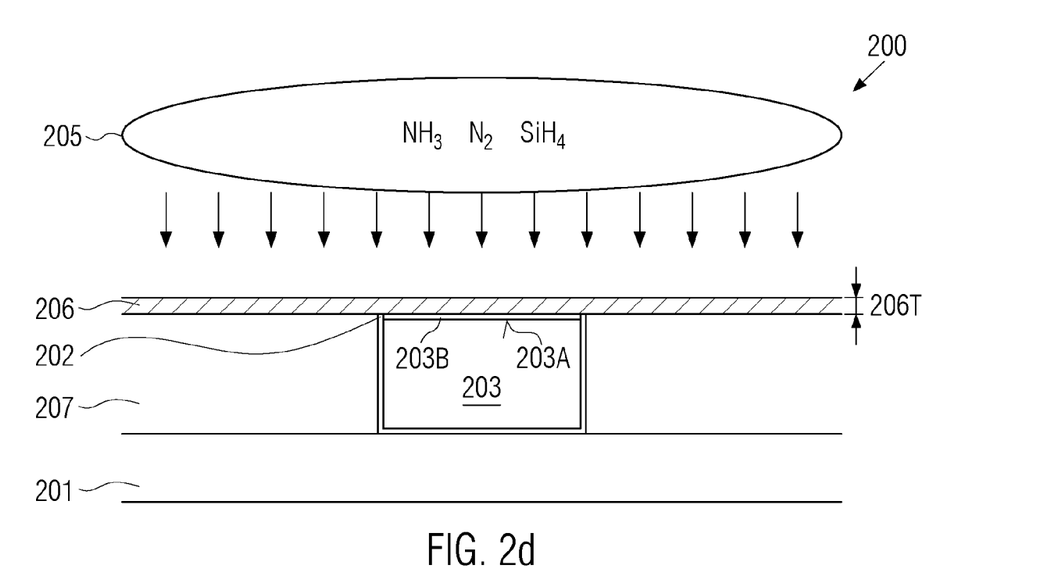

FIG. 2d schematically shows the semiconductor device 200 in a further advanced stage with a deposition ambient 205 for the formation of a silicon nitride capping layer 206, wherein, in an illustrative embodiment, the deposition ambient 205 is established in a first step without generating a plasma. For example, for the above-specified PECVD process tool, a flow rate of approximately 20-400 sccm, for instance approximately 150 sccm, for the precursor gas may be used. In this phase, the introduced precursor gas may also react with the pretreated exposed surface 203A, that is, with the layer 203B. The specified environment 205 as shown in FIG. 2d may be maintained for approximately 15-30 seconds, for example for approximately 20 seconds. Thereafter, a deposition plasma may be established so as to initiate the actual deposition process for forming the silicon nitride capping layer 206 with a desired thickness 206T in the range of approximately 50-2000 Å. The thickness 206T may be adjusted by controlling respective process parameters for establishing the deposition plasma ambient 205. In one illustrative embodiment using the above-specified PECVD tool, the values or value ranges for the flow rates of the gaseous components of the ambient 205 with ignited plasma may be the same as in the environment 204 of FIG. 2b; also the values or value ranges for the pressure and the substrate temperature may be the same as for the environment 204, wherein, however, the actually selected values for the various parameters in the deposition step of the plasma ambient 205 may differ from the corresponding parameter values of the environment 204 of FIG. 2b. The radio frequency power for establishing the deposition plasma ambient 205 may range from approximately 300-1000 watts, for example approximately 500 watts. It should be appreciated that an appropriate power density for establishing a plasma for other tool geometries and chamber configurations may be readily determined on the basis of the RF power specified before. With the values for the temperature, the flow rates and the pressure as specified above with reference to the environment 204 shown in FIG. 2b as illustrative examples, a value of approximately 50 nm for the thickness 206T may be achieved with a deposition time of approximately 20 seconds.

After a target thickness for the layer 206 is achieved, the supply of RF power may be discontinued and a pump step may be performed for approximately 15 seconds, wherein any supply of gaseous components is discontinued.

As a consequence, the silicon nitride capping layer 206 may be formed with a thickness of, for instance, approximately 5-200 nm, wherein an interface, which for convenience is also referred to as 203A, with the copper-based region 203 exhibits excellent characteristics with respect to adhesion and electromigration, wherein additionally a significant reduction of process time may be achieved compared to conventional capping layer formation sequences comprising a plasma-based pretreatment.

Figure 2E:
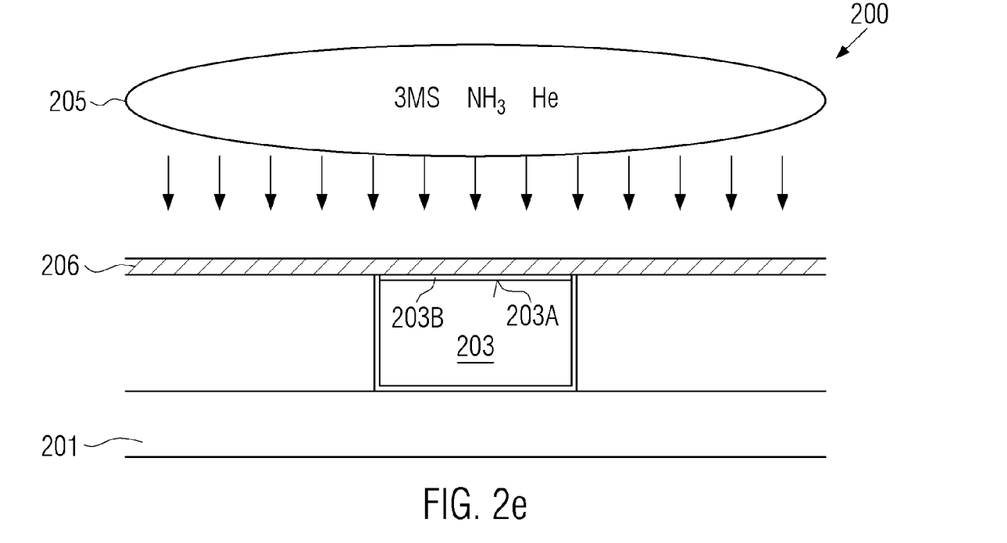

FIG. 2e schematically shows the device 200 according to a further illustrative embodiment, in which the deposition ambient 205 is configured for initiating the in situ deposition of the capping layer 206, which is now comprised of nitrogen-enriched silicon carbide (SiCN). Prior to the illustrated process step in FIG. 2e, a process sequence described above in FIGS. 2a-2c may have been performed, wherein a thermal-chemical pretreatment is performed in the specified environment 204 without applying any plasma. In an initial phase, the ambient 205 may be established without a plasma, wherein 3MS, ammonia and helium may be supplied to the ambient 205. Hereby, a pressure in the range of approximately 2-6 Torr, for instance approximately 3 Torr, may be adjusted, wherein the temperature of the substrate 201 may be maintained within the same range as previously used for pretreating the device 200 and generating the modified layer 203B. In some illustrative embodiments, the ratio of 3MS and helium may be set to be approximately 1:6 to 1:1, while the ratio of ammonia and helium may range from approximately 1:3 to 1:0.4. For the abovementioned deposition tool, these ranges may be obtained with the following flow rates: approximately 100-400 sccm, for example approximately 160 sccm, for 3MS; approximately 200-600 sccm, for example approximately 325 sccm, for ammonia; and approximately 200-1,000 sccm, for example approximately 400 sccm, for helium. This set-up step may be maintained for approximately 15-30 seconds, for instance for approximately 20 seconds.

Thereafter, a plasma may be established in the deposition ambient 205, wherein, in some illustrative embodiments, the other parameter values may be maintained. In one embodiment, for the above-specified deposition tool with an RF power between approximately 200-700 watts, for example, of approximately 300 watts, and a deposition time of approximately 21.5 seconds and using the exemplary values for temperature, pressure and flow rates as specified above, a thickness of approximately 50 nm may be obtained. Thereafter, a final pump step, for instance for approximately 15 seconds, may be performed, thereby removing any unwanted deposition byproducts. Similarly as explained with reference to the silicon nitride capping layer 206 of FIG. 2c, the SiCN capping layer 206 of FIG. 2d also has the improved modified layer and thus interface 203B, which exhibits a significantly enhanced resistance against electromigration effects compared to a conventionally formed SiCN capping layer.

Figure 2F:
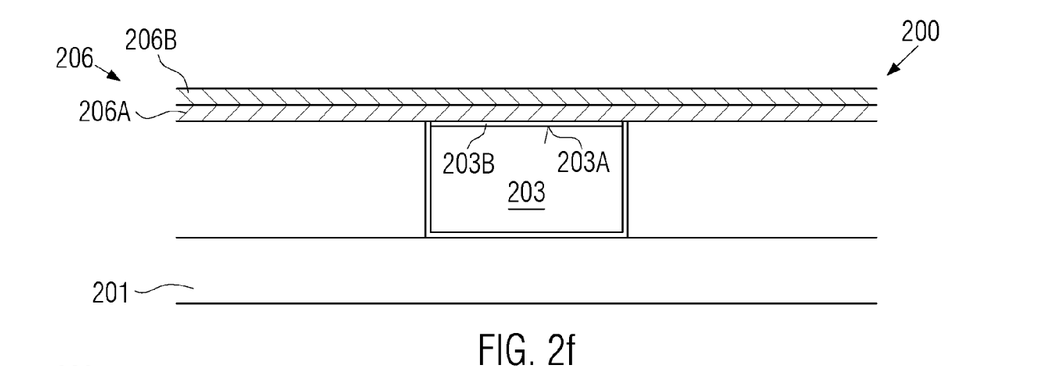

FIG. 2f schematically shows the semiconductor device 200 in accordance with still further illustrative embodiments, wherein the capping layer comprises a first sub-layer 206A and a second sub-layer 206B. For example, the sub-layer 206A may be comprised of silicon nitride (SiN), while the sub-layer 206B may be comprised of nitrogen-enriched silicon carbide (SiCN). In other embodiments, the sub-layer 206A may be comprised of SiCN, while the sub-layer 206B may be comprised of silicon nitride. The capping layer 206 as shown in FIG. 2f may be formed on the basis of the process sequences described above with reference to FIGS. 2a-2e, wherein a thermal-chemical pretreatment is performed in the specified environment 204 without applying any plasma, wherein, in one illustrative embodiment, the pretreatment is performed as is described with reference to FIGS. 2a and 2c and the deposition of silicon nitride may be initiated by establishing in situ the deposition plasma ambient 205 as shown in FIG. 2d. After a desired target thickness for the sub-layer 206A provided in the form of a silicon nitride layer is achieved, the supply of RF power may be discontinued and the plasma ambient 205 as described with reference to FIG. 2e may be established so as to initiate the deposition of the sub-layer 206B in the form of a SiCN layer.

Similarly, the above-described process sequence may be inverted with respect to the steps performed after the cleaning and modifying process described with reference to FIGS. 2a-2c so as to form an SiCN/SiN layer stack.

Figure 2G:
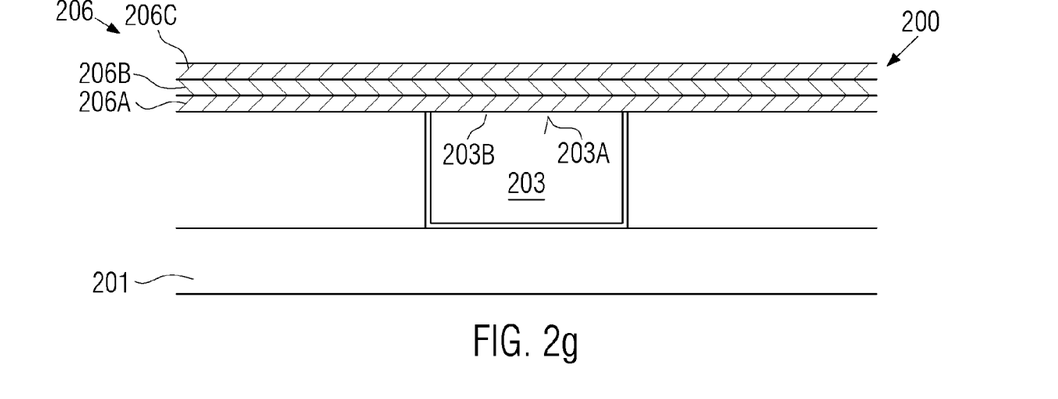

FIG. 2g schematically shows the semiconductor device 200 according to a further illustrative embodiment, wherein the capping layer 206 may include three sub-layers 206A, 206B and 206C. For example, the sub-layers 206A and 206C may represent nitrogen-enriched silicon carbide (SiCN) layers, while the sub-layer 206B may represent a silicon nitride (SiN) layer. In other embodiments, the sub-layers 206A and 206C may represent SiN layers while the sub-layer 206B may represent an SiCN layer. Regarding the formation of the capping layer 206 as shown in FIG. 2g, the same processes may be used as described with reference to FIG. 2f, wherein, additionally, a further plasma-based deposition ambient may be established to form the additional sub-layer 206C. However, contrary to the embodiments of FIG. 2f, in FIG. 2g, the thickness of the individual sub-layers 206A, 206B and 206C may be appropriately selected to achieve a desired total thickness of the capping layer 206 in accordance with device requirements. Thus, the sub-layers 206A, 206B and 206C may in general have a reduced thickness compared to the sub-layers 206A and 206B of FIG. 2f for the semiconductor device 200 having otherwise substantially the same configuration. The described process sequence may be extended to form more than three sub-layers in the capping layer 206.

As a result, the present invention provides an improved technique for forming a dielectric barrier or capping layer for copper-based metal regions as are typically encountered in highly sophisticated semiconductor devices including a highly conductive copper-based metallization layer. Contrary to conventional approaches, a high quality interface between the copper-based metal and a capping layer is achieved by a thermal-chemical pretreatment prior to the subsequent in situ deposition of the capping layer. This effect is believed to be caused by a slight controllable silane diffusion into a copper-based metal region prior to the actual deposition, thereby forming a modified surface layer with silicide and nitrogen. Subsequently, an interface of extremely high mechanical stability is formed after the deposition of the capping layer. On the other hand, a diffusion into the copper bulk and subsequently a non-desired modification of the copper line, such as silicide formation in the deeper lying copper volume, may be avoided by the new art of pretreatment. Investigations seem to indicate that a significantly enhanced resistance against electromigration may be obtained that may result in an approximately 3-5 times improved electromigration performance in terms of lifetime compared to a conventional nitrogen-enriched silicon carbide capping layer formed on the basis of an RF plasma ambient. Furthermore, a good adhesion of the capping layer according to the present invention on the copper-based metal is achieved. For instance, the coefficient $G_c$, may be in the range of approximately 10-40 J/m². In addition to the enhanced electromigration performance, the generation rate of copper hillocks is significantly reduced, because no RF power is heating the uncapped copper surface during the pretreatment, which is a characteristic of the conventional art of pretreatment. As an additional benefit, a significant reduction of process time is also achieved, thereby increasing throughput and reducing production cost.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a copper-based metal region in a dielectric layer of a metallization layer of a semiconductor device, said copper-based metal region having an exposed surface;
   cleaning said exposed surface using a thermal-chemical treatment in a gaseous ambient to form a cleaned surface, wherein performing said thermal-chemical treatment comprises supplying ammonia and nitrogen gases and heating said exposed surface;
   modifying the cleaned surface in a thermal treatment on the basis of a silicon-containing precursor; and
   depositing a capping layer on said modified surface, wherein no plasma is established at any point between a beginning of the cleaning of said exposed surface and an end of the modifying of the cleaned surface.

2. The method of claim 1, wherein depositing said capping layer is performed in situ with said modifying of the cleaned surface.

3. The method of claim 2, further comprising removing gaseous components of an ambient established during said modifying of the surface prior to depositing said capping layer.

4. The method of claim 3, further comprising establishing a deposition ambient for depositing said capping layer without a plasma and staffing a plasma for depositing said capping layer on the basis of said established deposition ambient.

5. The method of claim 1, wherein cleaning and modifying said surface are performed in situ.

6. The method of claim 1, wherein depositing said capping layer comprises supplying tri-methyl silane.

7. The method of claim 1, wherein depositing said capping layer comprises supplying tetra-methyl silane.

8. The method of claim 1, wherein depositing said capping layer comprises supplying silane.

9. The method of claim 1, wherein said silicon-containing precursor comprises at least one of silane ($SiH_4$), tri-methyl silane and tetra-methyl silane.

10. The method of claim 1, wherein a process time of said thermal treatment for modifying said cleaned surface is approximately 1-60 seconds.

11. The method of claim 10, wherein a process temperature during cleaning and modifying of said surface is approximately 250-500° C.

12. A method, comprising:
   providing a semiconductor device comprising a substrate having formed thereon a copper-based metal region having an exposed surface;
   cleaning said exposed surface by means of a thermal-chemical treatment in a gaseous ambient to form a cleaned surface, wherein performing said thermal-chemical treatment comprises supplying ammonia and nitrogen gases and heating said exposed surface;
   modifying a surface of the cleaned surface on the basis of a silicon-containing precursor, wherein no plasma is established at any point between a beginning of the cleaning of said exposed surface and an end of the modifying of said cleaned surface; and depositing in situ a capping layer in the presence of a deposition ambient; and establishing a plasma in the deposition ambient to initiate the depositing of the capping layer.

13. The method of claim 12, wherein cleaning said exposed surface comprises supplying said ammonia and nitrogen gases to said exposed surface prior to said surface modification process.

14. The method of claim 13, wherein said deposition ambient is created after removing byproducts of said modification process.

15. The method of claim 14, further comprising establishing said deposition ambient prior to creating said plasma.

16. The method of claim 12, wherein cleaning said exposed surface comprises heating said substrate to approximately 250-500° C.

17. The method of claim 16, wherein a pressure during cleaning said exposed surface is adjusted to approximately 1-10 Torr.

18. The method of claim 13, wherein cleaning said exposed surface comprises supplying ammonia and nitrogen prior to and during said modification process.

19. The method of claim 12, wherein said silicon-containing precursor comprises at least one of silane ($SiH_4$), tri-methyl silane and tetra-methyl silane.

* * * * *

UNITED STATES PATENT AND TRADEMARK OFFICE
CERTIFICATE OF CORRECTION

| | |
|---|---|
| PATENT NO. | : 7,678,699 B2 |
| APPLICATION NO. | : 11/531084 |
| DATED | : March 16, 2010 |
| INVENTOR(S) | : Joerg Hohage, Matthias Lehr and Volker Kahlert |

Page 1 of 1

It is certified that error appears in the above-identified patent and that said Letters Patent is hereby corrected as shown below:

Col. 12, line 36 (claim 4, line 3), delete "staffing" and insert therefor -- starting --.

Signed and Sealed this

Twenty-seventh Day of April, 2010

David J. Kappos
*Director of the United States Patent and Trademark Office*